United States Patent
Ozaki

(10) Patent No.: US 6,319,733 B1
(45) Date of Patent: Nov. 20, 2001

(54) METHOD OF MANUFACTURING SEMICONDUCTOR DEVICE, SEMICONDUCTOR EQUIPMENT AND MANUFACTURING SYSTEM

(75) Inventor: Hiroji Ozaki, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/395,219

(22) Filed: Sep. 14, 1999

(30) Foreign Application Priority Data

Apr. 22, 1999 (JP) .................................. 11-114629

(51) Int. Cl.$^7$ ........................... G01R 31/26; H01L 21/66; H01L 21/44; H01L 21/48; H01L 21/50

(52) U.S. Cl. ................................ 438/14; 438/16; 438/115

(58) Field of Search ................................ 438/14, 16, 115, 438/906, FOR 142

(56) References Cited

U.S. PATENT DOCUMENTS 5,550,372   8/1996   Yasue .

6,016,562 * 1/2000 Miyazuki et al. .

FOREIGN PATENT DOCUMENTS

| 62-86740 | 4/1987 | (JP) . |
|---|---|---|
| 63-135848 | 6/1988 | (JP) . |
| 7-94563 | 4/1995 | (JP) . |
| -7-94563- * | 4/1995 | (JP) . |
| 10-233374 | 9/1998 | (JP) . |

* cited by examiner

Primary Examiner—David E. Graybill
(74) Attorney, Agent, or Firm—Oblon, Spivak, McClelland, Maier & Neustadt, P.C.

(57) ABSTRACT

A manufacturing system compares information of foreign matter sensed by semiconductor equipment from on a semiconductor substrate with a selection reference thereby selecting optimum semiconductor equipment corresponding to the information of the foreign matter from a plurality of semiconductor equipment and processing the semiconductor substrate. Thus, a method of manufacturing a semiconductor device capable of improving the yield of the semiconductor device as well as a manufacturing system and semiconductor equipment to which the manufacturing method is applied, and a semiconductor device manufactured by the same are obtained.

16 Claims, 10 Drawing Sheets

METHOD OF MANUFACTURING SEMICONDUCTOR DEVICE, SEMICONDUCTOR EQUIPMENT AND MANUFACTURING SYSTEM

BACKGROUND OF THE INVENTION

1. Field of the Invention

The present invention relates to a semiconductor device having an integrated circuit or a discrete element, for example, a method of manufacturing the same, as well as a manufacturing system and semiconductor equipment to which the manufacturing method applied.

2. Description of the Background Art

FIG. 27 is a conceptual diagram showing a conventional manufacturing system MSa. The manufacturing system MSa manufactures at least one semiconductor device DVa from a semiconductor substrate W.

The manufacturing system MSa includes n semiconductor equipment PAa, a control unit CAa and a database DBa. Unique numbers from No. 1 to No. n are assigned to the semiconductor equipment PAa respectively.

Operations of the conventional manufacturing system MSa are now described. The control unit CAa controls each semiconductor equipment PAa, to make the semiconductor equipment PAa process the semiconductor substrate W in order shown in FIG. 28, for example. The database DBa previously stores this order.

If it turns out that large foreign matter adheres to the semiconductor substrate W processed by the third semiconductor equipment PAa in FIG. 28, the database DBa stores this information. If it thereafter turns out from the information stored in the database DBa that the third semiconductor equipment PAa has caused the large foreign matter, the third semiconductor equipment PAa is inspected, not to cause large foreign matter. Alternatively, operations of the third semiconductor equipment PAa are corrected as described in Japanese Patent Laying-Open Gazette No. 10-233374 (1998), for example.

In general, however, the semiconductor substrate W processed by the third semiconductor equipment PAa shown in FIG. 28 is processed by the first, second, . . . semiconductor equipment PAa along the order stored in the database DBa in the state having the large foreign matter adhering thereto, to form the semiconductor device DVa. Thus, the yield of the semiconductor device DVa is disadvantageously reduced due to the large foreign matter.

SUMMARY OF THE INVENTION

According to a first aspect of the present invention, a method of manufacturing at least one semiconductor device from a semiconductor substrate with a plurality of semiconductor equipment comprises steps of (a) comparing information sensed by the semiconductor equipment from on the semiconductor substrate with a selection reference thereby selecting the semiconductor equipment corresponding to the information from the plurality of semiconductor equipment, and (b) performing processing on the semiconductor substrate with the semiconductor equipment selected through the step (a).

According to the first aspect, the optimum semiconductor equipment can be selected in response to the information of the semiconductor substrate to process the semiconductor substrate, whereby the yield of the semiconductor device can be improved.

According to a second aspect of the present invention, the step (b) includes steps of (b-1) changing the information on the semiconductor substrate with the semiconductor equipment selected through the step (a), and (b-2) sensing information from on the semiconductor substrate with the semiconductor equipment selected through the step (a) after the step (b-1), and the method further includes a step (c) of updating the selection reference from the information sensed through the step (b-2).

According to the second aspect, more optimum semiconductor equipment can be selected by updating the selection reference from the information on the processed semiconductor substrate, whereby the yield of a semiconductor device manufactured from a subsequently processed semiconductor substrate can be improved.

According to a third aspect of the present invention, the method of manufacturing a semiconductor device further includes steps of (d) testing the semiconductor device, and (e) updating the selection reference from a test result obtained through the step (d).

According to the third aspect, more optimum semiconductor equipment can be selected by updating the selection reference from the result of the test on the semiconductor device, whereby the yield of the semiconductor device manufactured from the subsequently processed semiconductor substrate can be improved.

According to a fourth aspect of the present invention, the information is foreign matter or a defect.

According to the fourth aspect, reduction of the yield of the semiconductor device caused by foreign matter or a defect can be suppressed.

According to a fifth aspect of the present invention, the information is foreign matter, and the step (b-1) includes a step (b-1-1) of removing the foreign matter with the semiconductor equipment selected through the step (a).

According to the fifth aspect, foreign matter can be removed in an intermediate stage of the manufacturing process, whereby reduction of the yield of the semiconductor device can be suppressed.

According to a sixth aspect of the present invention, semiconductor equipment employed for the method of manufacturing a semiconductor device according to the first aspect of the present invention has a function of sensing information from on the semiconductor substrate.

According to the sixth aspect, it is possible to structure such a manufacturing system that semiconductor equipment itself determines and selects semiconductor equipment employed next.

According to a seventh aspect of the present invention, a manufacturing system manufactures the semiconductor device from the semiconductor substrate by the method of manufacturing a semiconductor device according to the first aspect.

According to the seventh aspect of the present invention, the manufacturing system can select the optimum semiconductor equipment for processing the semiconductor device by sensing information from the semiconductor device. Thus, the optimum order for employing the optimum semiconductor equipment can be automatically decided from the information of the semiconductor substrate regardless of the order for employing the semiconductor equipment previously set in a database, for example, for manufacturing a semiconductor device having a high yield.

According to an eighth aspect of the present invention, a semiconductor device is manufactured by the method of manufacturing a semiconductor device according to the first aspect.

According to the eighth aspect, the semiconductor device hardly fails since the same is manufactured with the optimum semiconductor equipment.

An object of the present invention is to provide a method of manufacturing a semiconductor device which can improve the yield of a semiconductor device, a manufacturing system and semiconductor equipment to which the manufacturing method is applied, and a semiconductor device manufactured by the same.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1.

Figure 1:
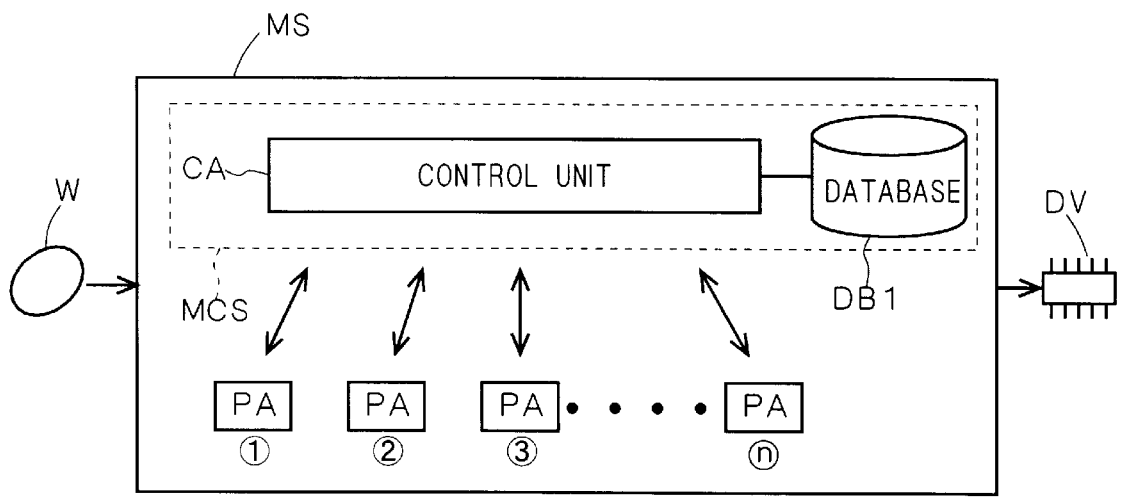
FIG. 1 is a conceptual diagram showing a manufacturing system according to an embodiment 1 of the present invention.
Figure 2:
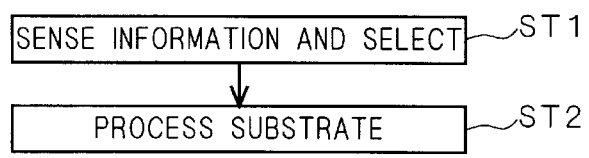
FIG. 2 is a flow chart showing a method of manufacturing a semiconductor device according to the embodiment 1 of the present invention.

FIG. 1 shows a manufacturing system MS according to an embodiment 1 of the present invention. The manufacturing system MS manufactures at least one semiconductor device DV from a semiconductor substrate W.

The manufacturing system MS includes n semiconductor equipment PA and a production control system MCS controlling production of the semiconductor device DV. The production control system MCS includes a control unit CA controlling the n semiconductor equipment PA and a database DB1 for storing information for controlling the n semiconductor equipment PA, information related to the yield of the semiconductor device DV and the like. Unique numbers from No. 1 to No. n are assigned to the semiconductor equipment PA respectively.

Operations of the manufacturing system MS according to the embodiment 1 are now described with reference to FIGS. 1 to 3 and FIG. 28. The control unit CA controls each semiconductor equipment PA, to make the semiconductor equipment PA process the semiconductor substrate W in the order shown in FIG. 28, for example. The database DB1 previously stores this order.

Figure 3:
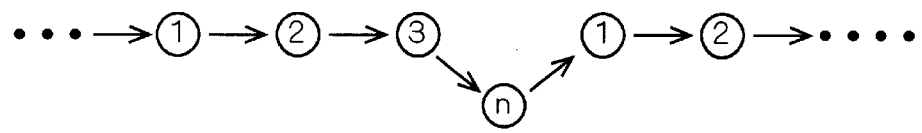
FIG. 3 is a state transition diagram showing operations of the manufacturing system according to the embodiment 1 of the present invention.

In an intermediate stage of the manufacturing process, foreign matter (dust particle or contamination) may adhere onto the semiconductor substrate W due to a cause on the device, a factious cause or an environmental cause. If the third semiconductor equipment PA shown in FIG. 28 senses large foreign matter (information) from the semiconductor substrate W immediately after processing the semiconductor device W (step ST1), the large foreign matter is removed with the n-th semiconductor equipment PA as shown in FIG. 3 (step ST2). If the third semiconductor equipment PA in FIG. 28 senses such information that no foreign matter is present from the semiconductor substrate W immediately after processing the semiconductor substrate W (step ST1), on the other hand, it follows that the semiconductor substrate W is processed with the first semiconductor equipment PA along the order shown in FIG. 28 (step ST2).

The content of the previous step (the step employing the third semiconductor equipment PA in FIG. 3, for example) may be a step which must flatten the semiconductor substrate W by trench isolation (embedding an insulator film), formation of a multilevel interconnection layer (damascene process) or the like, a step which may not flatten the semiconductor substrate W, an etchback step, or a reflow step for the insulator film.

When large foreign matter is sensed from the semiconductor substrate W as described above, the n-th semiconductor equipment PA corresponding to the large foreign matter is selected from the first to n-th semiconductor equipment PA regardless of the order for employing the semiconductor equipment PA previously set in the database DB1 and employed for removing the foreign matter adhering to the semiconductor substrate W. Consequently, the yield of the semiconductor device DV is improved.

Further, the semiconductor device DV hardly fails since the same is manufactured with the optimum semiconductor equipment with removal of the foreign matter.

Embodiment 2.

According to an embodiment 2 of the present invention, n-th semiconductor equipment PA is a foreign matter remover PAn having a function of sensing information from a semiconductor substrate W.

Figure 4:
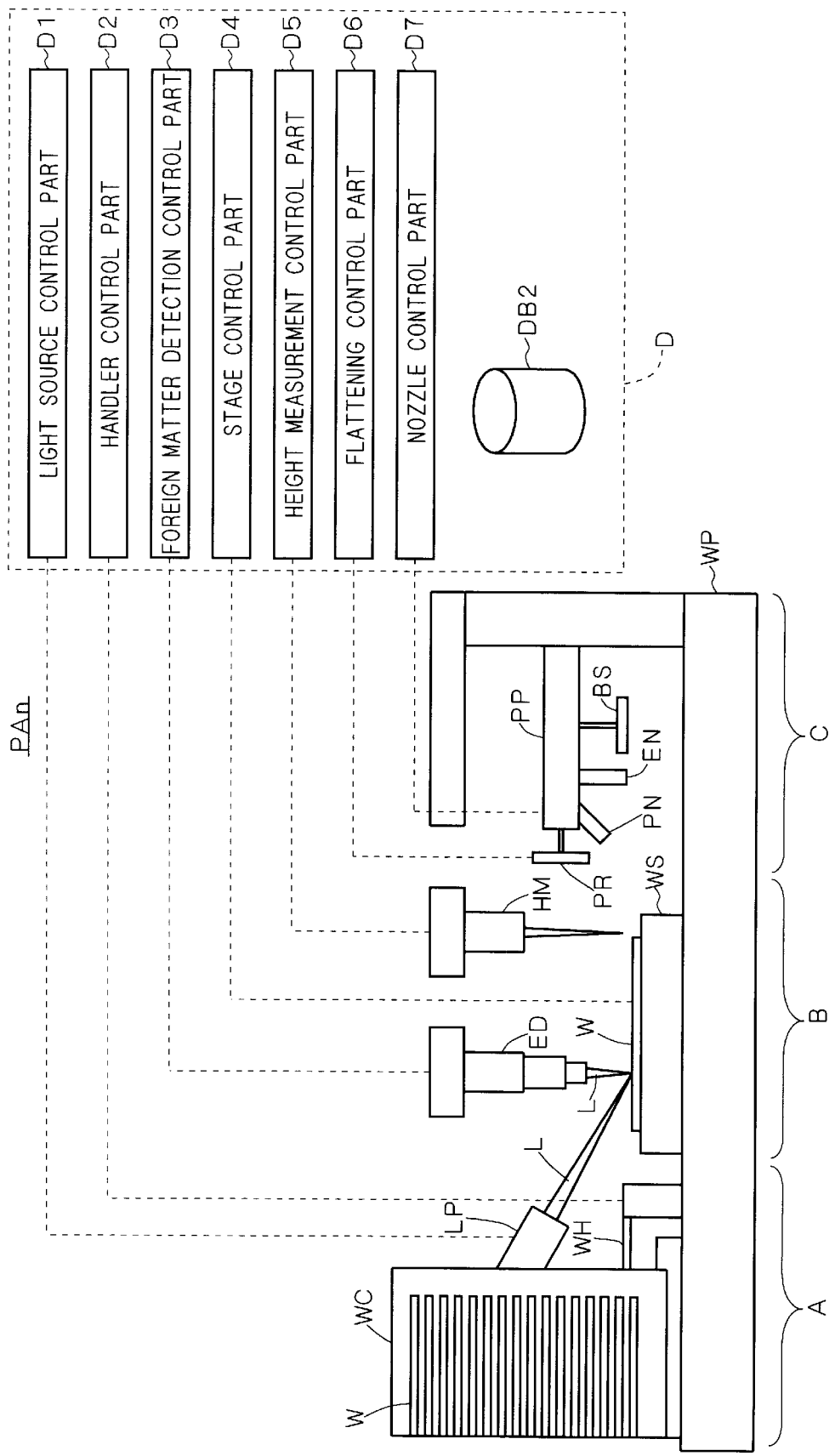
FIG. 4 is a conceptual diagram showing a foreign matter remover according to an embodiment 2 of the present invention.

FIG. 4 is a conceptual diagram showing the foreign matter remover PAn. The foreign matter remover PAn includes a wafer handler part A controlling a function of loading the semiconductor substrate W, an information sensing part B controlling a function of sensing information from on the semiconductor substrate W, a foreign matter removing part C controlling a function of removing foreign matter on the semiconductor substrate W, and a control part D controlling a function of controlling these.

The control part D includes a light source control part D1, a handler control part D2, a foreign matter detection control part D3, a stage control part D4, a height measurement control part D5, a flattening control part D6, a nozzle control part D7 and a database DB2. Data in the database DB2 are accumulated and stored also in a database DB1 (FIG. 1).

The wafer handler part A includes a wafer handler WH, a mount WP receiving a wafer case WC transferred from semiconductor equipment PA of a previous step and a wafer stage WS moving on the mount WP.

The information sensing part B includes a light projector LP, a foreign matter sensor ED and a height measurer HM. The light projector LP is controlled by the light source control part D1, to irradiate the semiconductor substrate W placed on the wafer stage WS with light L. The foreign matter sensor ED senses the light L reflected from the semiconductor substrate W. The foreign matter detection control part D3 senses the number and the size of the foreign matter on the semiconductor substrate W and the state of distribution on the semiconductor substrate W in response to a sensing signal output from the foreign matter sensor ED. When measuring the height of the foreign matter, the stage control part D4 controls the wafer stage WS so that the foreign matter on the semiconductor substrate W is located on a prescribed position. The height measurer HM senses the foreign matter. The height measurement control part D5 determines the height of the foreign matter in response to a sensing signal output from the height measurer HM. Thus, the information sensing part B can sense information (number, size, state of distribution and height) of the foreign matter from the semiconductor substrate W.

Figure 5:
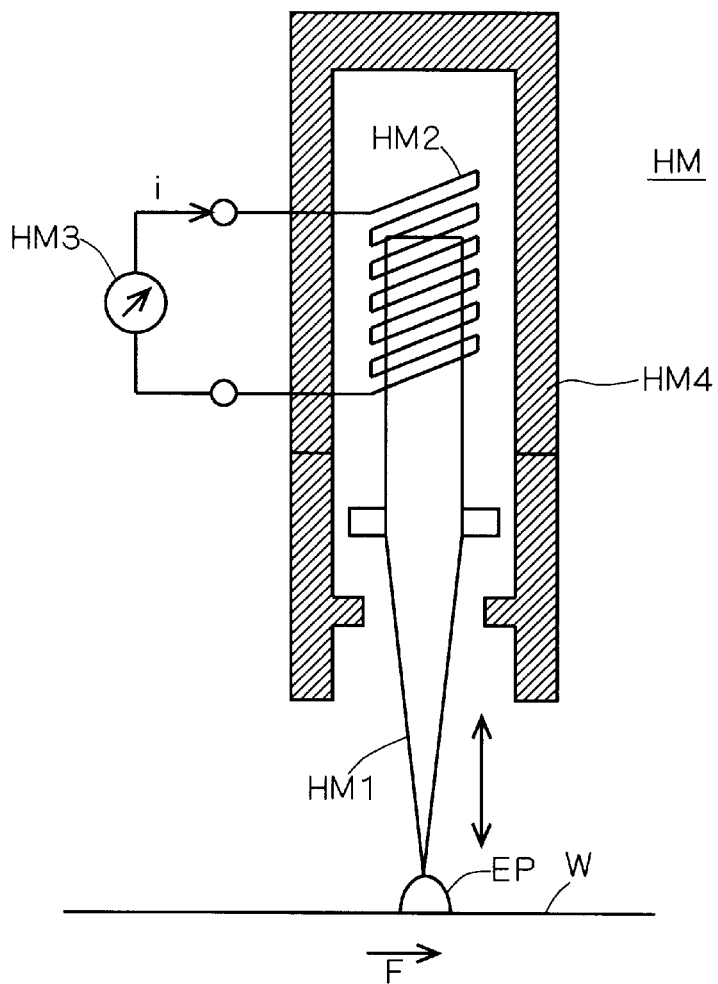
FIG. 5 is a conceptual diagram showing a height measurer according to the embodiment 2 of the present invention.
Figure 6:
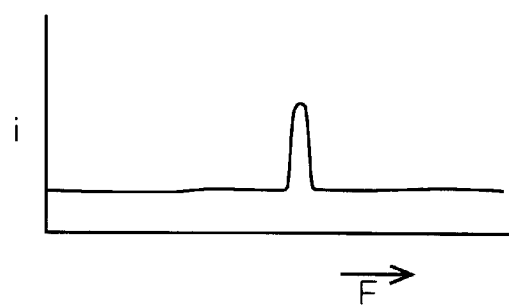
FIG. 6 is a graph for illustrating operations of the height measurer according to the embodiment 2 of the present invention.

The principle of height determination of the foreign matter is described with reference to FIGS. 5 and 6. The height measurer HM includes a prober HM1, a coil HM2, a current detector HM3 and a prober body HM4. The forward end of the prober HM1 moves in parallel along a direction F while being in contact with the surface of the semiconductor substrate W. If the prober HM1 vertically moves due to foreign matter EP, a current i electromagnetically induced by the coil HM2 mounted on the prober HM1 flows as shown in FIG. 6. Thus, the prober HM1 scans the semiconductor substrate W and vertically moves with respect to the semiconductor substrate W, and the current i flows in correspondence with the amount of this movement. The current detector HM3 outputs the value of the sense current i to the height measurement control part D5 (FIG. 4) as a sensing signal. The height measurement control part D5 determines the height of the foreign matter EP by comparing the current value indicated by the sensing signal with reference data and making calculation.

Referring again to FIG. 4, the foreign matter removing part C includes a polisher PR, a polishing solution injection nozzle PN, a gas injection nozzle EN, a brush scrubber BS and a movable mount PP. The movable mount PP supports the polisher PR, the polishing solution injection nozzle PN, the gas injection nozzle EN and the brush scrubber BS. The flattening control part D6 controls the polisher PR and the brush scrubber BS. The nozzle control part D7 controls the polishing solution injection nozzle PN and the gas injection nozzle EN. The polisher PR, the polishing solution injection nozzle PN, the gas injection nozzle EN and the brush scrubber BS are employed for removing the foreign matter from the semiconductor substrate W placed on the wafer stage WS. Detailed operations of the foreign matter removing part C are described later with reference to an embodiment 3. FIG. 4 shows an exemplary structure of the foreign matter removing part C, which may alternatively be formed by combining various devices as described later with reference to the embodiment 3.

Figure 7:
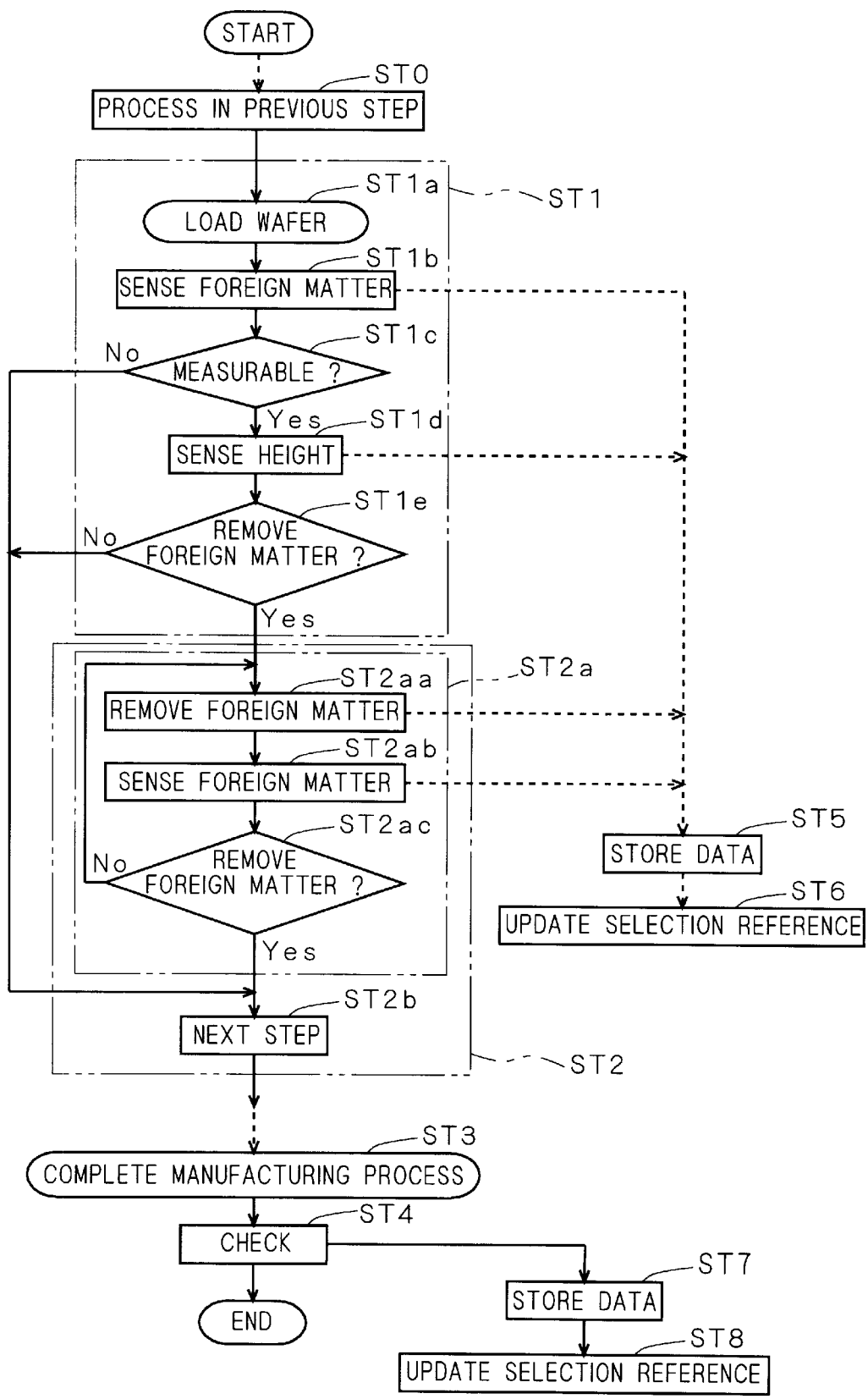
FIG. 7 is a flow chart showing a method of manufacturing a semiconductor device according to the embodiment 2 of the present invention.

Operations of the manufacturing system MS when the n-th semiconductor equipment PA is the foreign matter remover PAn are now described with reference to FIGS. 1 to 4 and 7. As shown in FIG. 7, the operations of the manufacturing system MS include steps ST0 to ST4. The steps ST1 and ST2 shown in FIG. 7 correspond to those in FIG. 2.

First, the semiconductor substrate W is processed with the third semiconductor equipment PA, for example (step ST0), and thereafter transferred to the n-th foreign matter remover PAn in the state stored in the wafer case WC, which in turn is placed on the mount WP. The wafer handler WH is controlled by the handler control part D2 to place the semiconductor substrate W on the wafer stage WS from the wafer case WC (step ST1a).

Then, the information sensing part B first senses the number, size and the state of distribution of the foreign matter from the semiconductor substrate W, as described above (step ST1b). The control part D stores the number, size and the state of distribution of the foreign matter in the database DB2 (step ST5).

Then, the control part D compares the size of the foreign matter with a selection reference for the size of the foreign matter stored in the database DB2, and determines whether or not the height of the foreign matter is measurable (step ST1c). The process advances to a step ST1d if the height of the foreign matter is measurable. Otherwise the first semiconductor equipment PA is selected on the assumption that the foreign matter is so small that the height thereof is unmeasurable and the foreign matter exerts no influence on the yield of the semiconductor device DV, and the process advances to a step ST2b.

At the step ST1d, the information sensing part B detects the height of the foreign matter. Then, the control part D compares the detected height of the foreign matter with the selection reference for the height of the foreign matter stored in the database DB2, and determines whether or not the foreign matter must be removed for preventing reduction of the yield (step ST1e). If the foreign matter must be removed, the foreign matter removing part C of the foreign matter remover PAn itself is selected and the process advances to a step ST2a of the step ST2. Otherwise the first semiconductor equipment PA is selected and the process advances to the step ST2b.

At the step ST2a, the foreign matter removing part C of the foreign matter remover PAn removes the foreign matter from the semiconductor substrate W (in other words, updates the information on the semiconductor substrate W). When the step ST2a is completed, the process advances to the step ST2b. The contents of the step ST2a are described later with reference to the embodiment 3.

At the step ST2b, the first semiconductor equipment PA performs processing such as film formation, for example, on the semiconductor substrate W.

Thereafter the semiconductor substrate W passes through the manufacturing process (step ST3), to complete the semiconductor device DV.

Then, the semiconductor device DV is checked (step ST4) so that a check result obtained through this step is stored in the database DB1 (step ST7).

The control unit CA calculates the yield of the semiconductor device DV from the check result stored in the database DB1. If the yield of the semiconductor device DV is lower than a reference value, the selection reference employed at the step ST1c or ST1e is strictly updated (for example, the selection reference for the height of the foreign matter at the step ST1e is reduced). Thus, it is determined at the step ST1e for a semiconductor substrate W of a subsequently processed lot that foreign matter must be removed even if the height of the foreign matter is small and the foreign matter removing part C of the foreign matter remover PAn itself is selected and the process advances to the step ST2a of the step ST2, so that the foreign matter having small height is also removed. Thus, the yield of the semiconductor device DV can be improved.

Embodiment 3.

As described with reference to the embodiment 2, the foreign matter removing part C of the foreign matter remover PAn can be regarded as that for repair in an intermediate stage in the manufacturing process for the semiconductor substrate W. Hence, foreign matter is desirably brought into a degree not reducing the yield for every adhering situation of the foreign matter. With reference to the embodiment 3 of the present invention, desirable operations and structure of a foreign matter removing part C of a foreign matter remover PAn are described.

Desirable Operations of Foreign Matter Remover PAn:

As shown in the step ST2$a$ of FIG. 7, the foreign matter remover PAn desirably removes foreign matter by feedback control. In other words, a wafer stage WS receiving a semiconductor substrate W first moves from an information sensing part B to a foreign matter removing part C, so that the foreign matter removing part C removes foreign matter from the semiconductor substrate W with a polisher PR or the like mounted on a movable mount PP (step ST2$aa$). Then, the information sensing part B detects the height of the foreign matter, similarly to the step ST1$d$ (step St2$ab$). Then, a control part D compares the detected height of the foreign matter with a selection reference for the height of the foreign matter stored in a database DB2 similarly to the step ST1$e$, and determines whether or not the foreign matter must be removed again for preventing reduction of the yield (step ST2$ac$). The process returns to the step ST2$aa$ if the foreign matter must be removed. Otherwise the process advances to a step ST2$b$ on the assumption that the foreign matter is at a degree not reducing the yield.

As described above, the foreign matter remover PAn removes the foreign matter by feedback control, whereby transition to a next step with the foreign matter remaining on the semiconductor substrate W can be prevented. If the foreign matter remains, resist cannot be homogeneously applied onto the semiconductor substrate W (trouble striation), an error remarkably occurs in exposure to the resist when the height of the foreign matter is larger than a focus margin (pattern defocus), heterogeneous formation of a conductor film is induced by etchback processing for flattening an oxide film or the like deposited on the foreign matter, or a failure is caused on patterning. Such a trouble is unrepairable in an intermediate stage of the manufacturing process and remarkably influences reduction of the yield of the semiconductor device DV. Thus, the foreign matter is desirably completely removed by feedback control.

If the height of the foreign matter sensed at the step ST1$d$ stored in the database DB2 is substantially identical to that of the foreign matter sensed at the step ST2$ab$ (difference between the height of the foreign matter sensed at the step ST1$d$ and that sensed at the step S2$ab$ is not more than a prescribed value), it means that the foreign matter is hardly removed through the step ST2$a$. In this case, the manufacturing process is rendered redundant due to the step ST2$a$, to increase the manufacturing cost. In this case, therefore, the selection reference employed in the step ST1$c$ or ST1$e$ is loosely updated (the selection reference for the height of the foreign matter at the step ST1$e$ is enlarged, for example). Thus, it is determined at the step ST1$e$ for a semiconductor substrate W of a subsequently processed lot that foreign matter may not be removed even if the foreign matter has large height, and first semiconductor equipment PA is selected so that the process advances to the step ST2$b$ of the step ST2. Thus, the manufacturing cost can be suppressed.

Desirable Structure of Foreign Matter Remover PAn:

The foreign matter removing part C desirably has both of the polisher PR and a brush scrubber BS. The foreign matter removing part C removes the foreign matter with the brush scrubber BS if the foreign matter merely adheres onto the semiconductor substrate W (individual removing flow), while removing the foreign matter with the polisher PR if the foreign matter sinks into a film formed on the semiconductor substrate W or is present in the film formed on the semiconductor substrate W (flattening flow). Whether the foreign matter merely adheres onto the semiconductor substrate W, sinks into the film formed on the semiconductor substrate W or is present in the film formed on the semiconductor substrate W can be determined from the characteristics of the waveform of the current i shown in FIG. 6, for example. When the foreign matter removing part C has both of the polisher PR and the brush scrubber BS, foreign matter present on, in or within the film can be removed, as described above.

Individual Removing Flow:

When having the brush scrubber BS, the foreign matter removing part C desirably has a gas injection nozzle EN too. In this case, the gas injection nozzle EN injects a liquid (pure water, dilute hydrofluoric acid, aqueous ammonia, citric acid or the like, for example) capable of removing metallic foreign matter to the semiconductor substrate W, for scrubbing/washing the semiconductor substrate W by CMP (chemical mechanical polishing) with the rotating brush scrubber BS. The liquid injected from the gas injection nozzle EN may be supplied with ultrasonic waves. The liquid adhering onto the semiconductor substrate W may be removed by rotating the wafer stage WS at a high speed.

Flattening Flow:

When having the polisher PR, the foreign matter removing part C desirably has a polishing solution injection nozzle PN too. In this case, the polishing solution injection nozzle PN injects a polishing solution (slurry) to the semiconductor substrate W, for flattening the surface of the semiconductor substrate W by CMP with the polisher PR. The polishing solution is preferably selected as follows: If the polished film provided on the surface of the semiconductor substrate W is an oxide film, the polishing solution is prepared from an alkaline solution of silica or a neutral solution of cerium oxide. If the polished film provided on the surface of the semiconductor substrate W is made of polysilicon, the polishing solution is prepared from an alkaline solution of silica, an inorganic alkaline solution of silica or an organic alkaline solution of silica. If the polished film provided on the surface of the semiconductor substrate W is made of tungsten (W), the polishing solution is prepared from that containing alumina, pure water and an oxidizer. If the polished film provided on the surface of the semiconductor substrate W is made of copper (CU), a polishing solution containing alumina, $Fe(NO_3)_3$, $NH_4OH$ and $K_3Fw(CN)_6$ is employed.

At the step ST2$aa$, only the flattening flow, only the individual removing flow, or both of the flattening flow and the individual removing flow may be executed.

Polisher:

The polisher PR is made of a porous material such as polyurethane foam. The polishing speed (the film thickness polished in one second) depends on the material of a polishing agent contained in the polishing solution, the hardness, size and concentration of the polishing agent, the ratio of water contained in the polishing solution, the material, surface shape and rotation speed of the polisher PR and the pressure applied from the polisher PR to the polished object. When the contact area between the polisher PR and the polished object is several 10 μm to several mm and the pressure applied from the polisher PR to the polished object is 0.1 kg/cm² (depending on the material of the polished object), for example, setting is so made that a rotation speed of several 10 Å/sec. to several 100 Å/sec. is obtained with a rotational frequency of several 100 rpm. With this degree of rotation speed, the foreign matter can be removed in a short time without damaging the polished object.

The aforementioned polishing solution and the rotation speed and pressure of the polisher PR are set on the basis of data in the database DB2 previously determined with reference to past examples.

The contact area between the polisher PR and the polished object, set to several 10 μm to several mm in the above, may be smaller. While the polishing solution injection nozzle PN injects the polishing agent to the polisher PR by CMP, the polishing agent may be applied to the polisher PR itself for performing dry processing.

Figure 8:
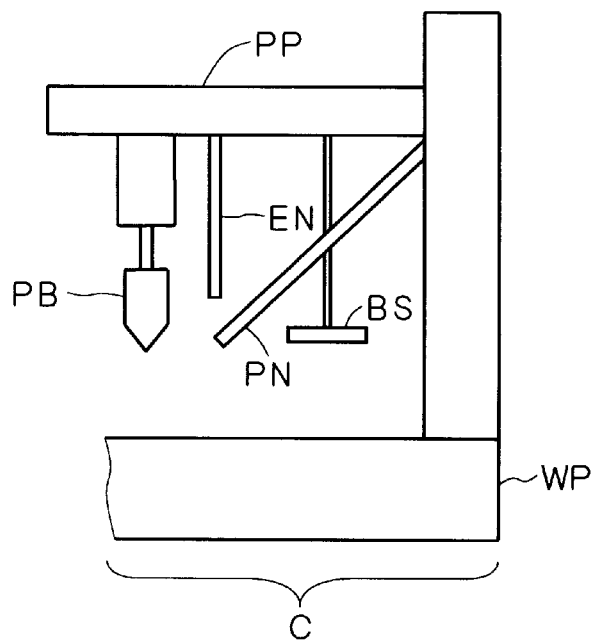
FIGS. 8 to 25 are conceptual diagrams showing modifications of a foreign matter removing part according to an embodiment 3 of the present invention.
Figure 9:
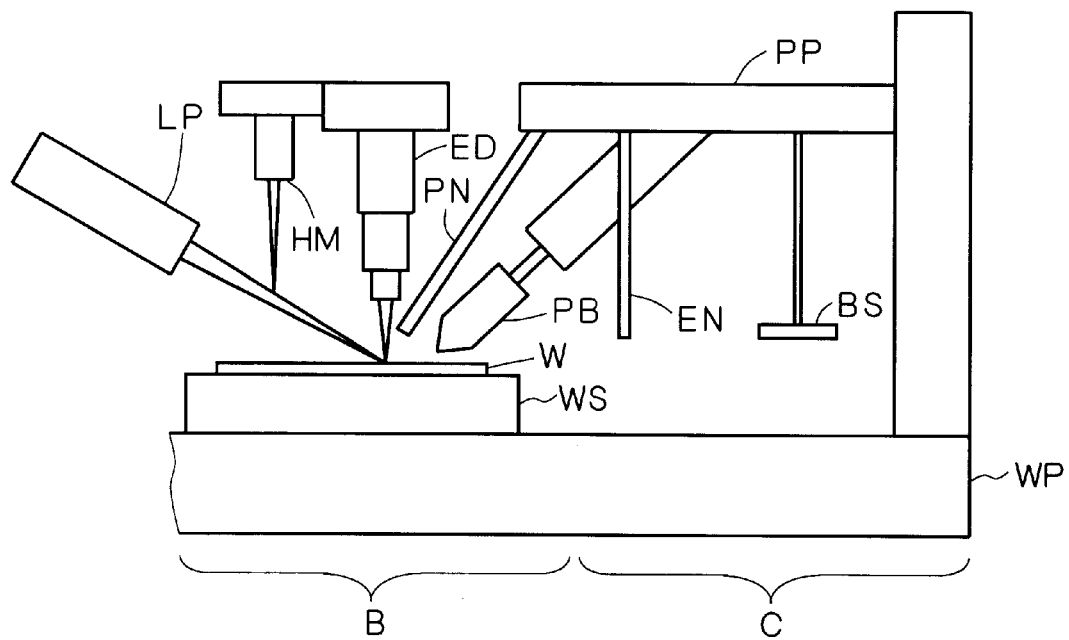

The drum-type polisher PR may be replaced with a polisher PB having a sharp forward end, as shown in FIG. 8. Further, the movable mount PP may expand/contract or the angles of the polishing solution injection nozzle PN and the polisher PB (or the polisher PR) may be rendered changeable as shown in FIG. 9, for polishing the surface of the semiconductor substrate W while sensing the height of the foreign matter with the information sensing part B. Thus, the processing time at the step ST2a can be reduced. In this case, the foreign matter remover PAn may be provided with a monitor (not shown) displaying the surface of the semiconductor substrate W and an operation panel (not shown) for manually operating the foreign matter removing part C. Thus, if the foreign matter cannot be automatically removed, an operator can remove the foreign matter by operating the foreign matter removing part C through the operation panel while confirming the foreign matter on the monitor.

Figure 10:
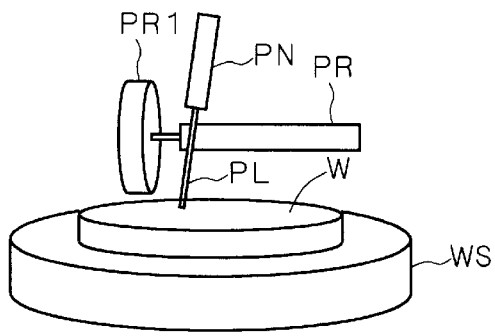
Figure 11:
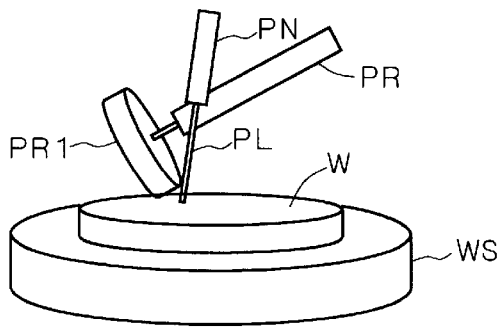
Figure 12:
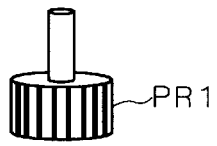
Figure 13:
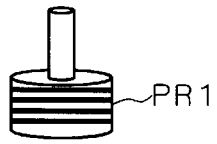
Figure 14:
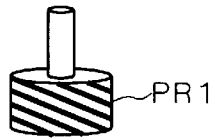
Figure 15:
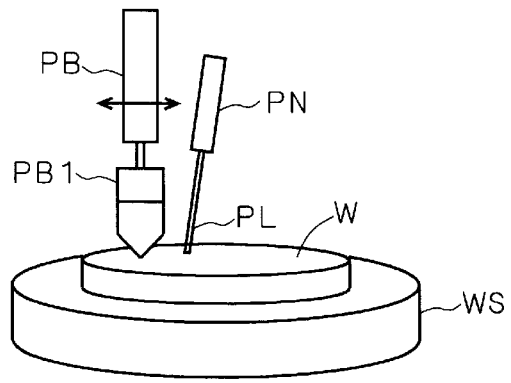
Figure 16:
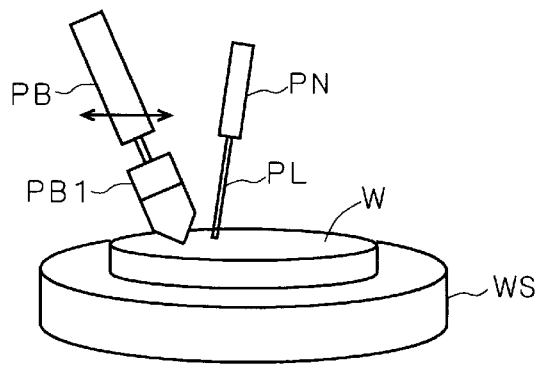
Figure 17:
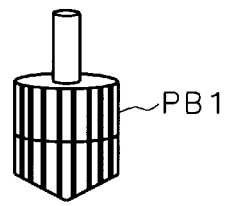
Figure 18:
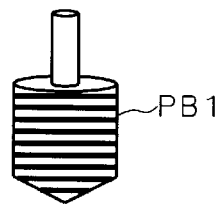
Figure 19:
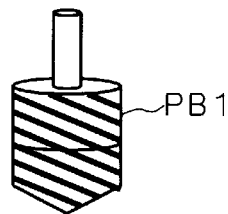
Figure 20:
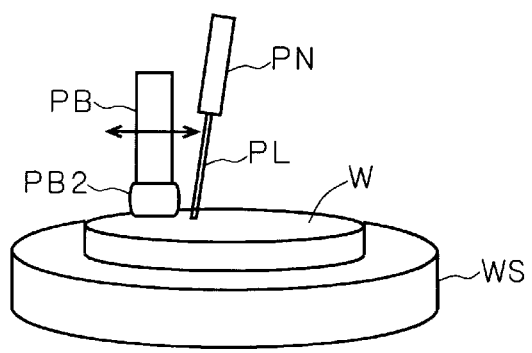
Figure 21:
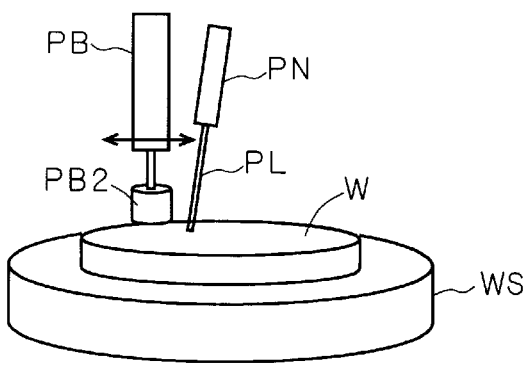
Figure 22:
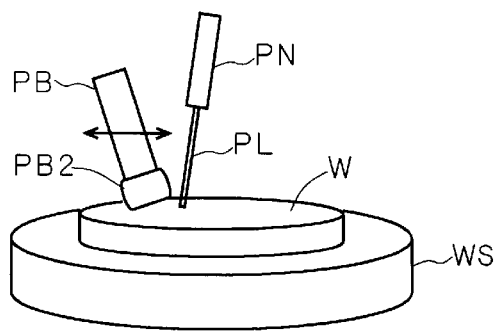
Figure 23:
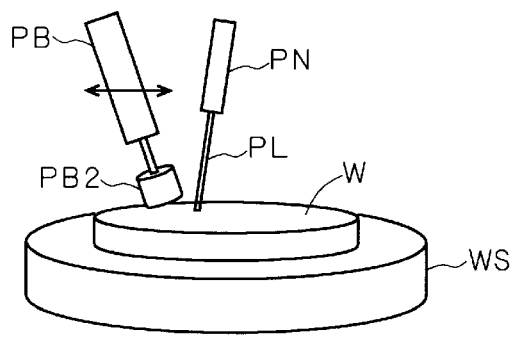
Figure 24:
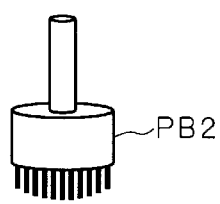
Figure 25:
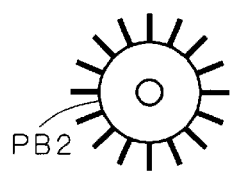

The angle of the polisher PR with respect to the semiconductor substrate W may be rendered changeable as shown in FIGS. 10 and 11. Grooves provided on a rotator PR1 of the forward end of the polisher PR may be vertical (FIG. 12), transverse (FIG. 13) or oblique (FIG. 14) with respect to the axis of rotation. Further, the angle of the polisher PB with respect to the semiconductor substrate W may be rendered changeable as shown in FIGS. 15 and 16. Grooves provided on a rotator PB1 of the forward end of the polisher PB may be vertical (FIG. 17), transverse (FIG. 18) or oblique (FIG. 19) with respect to the axis of rotation. Further, the forward end of the polisher PB may be elastic as shown in FIGS. 20 and 21. Further, the angle of the polisher PB with respect to the semiconductor substrate W may be rendered changeable as shown in FIGS. 20 to 23. Further, the forward end of the polisher PB may have a rotator PB2 provided with a brush. FIG. 24 is a side elevational view of the rotator PB2, and FIG. 25 is a top plan view of the rotator PB2.

It is possible to cope with a larger number of adhering situations of foreign matter due to the structures described with reference to FIGS. 8 to 25.

Others:

An offline unit (terminal unit) (not shown) may be provided for transferring data between the offline unit and the databases DB1 and DB2.

Each of the wafer handler part A, the information sensing part B and the foreign matter removing part C may be provided on the mount WP in singular or in plural.

The foreign matter remover PAn may perform processing in units of the wafer case WC or in units of the semiconductor substrate W. The wafer stage WS may be provided on the mount WP in singular or in plural.

If the wafer stage WS is movable not only in the direction along the surface of the mount WP but also in a direction perpendicular to the surface of the mount WP, the foreign matter can be more precisely sensed and removed by the information sensing part B and the foreign matter removing part C.

If a plurality of foreign matter is present on the semiconductor substrate W, the steps ST2aa, ST2ab and ST2ac (FIG. 7) may be carried out for each foreign matter. The height of the foreign matter may be sensed by single measurement or a plurality of times of measurement.

Figure 26:
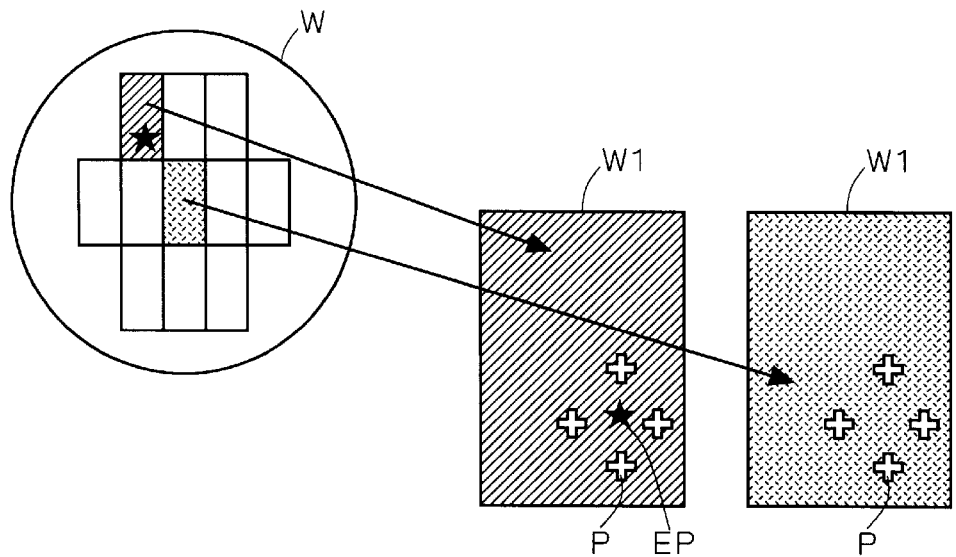
FIG. 26 is a conceptual diagram showing a modification of operations of an information sensing part according to the embodiment 3 of the present invention.
Figure 27:
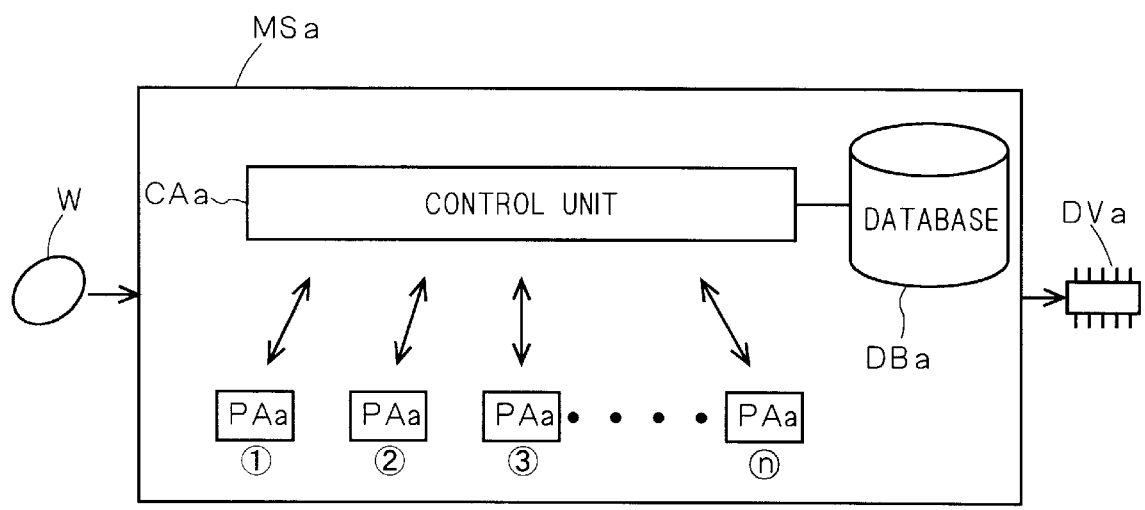
FIG. 27 is a conceptual diagram showing a conventional manufacturing system.
Figure 28:
FIG. 28 is a state transition diagram showing operations of the manufacturing system.

For example, the height of the foreign matter EP on the semiconductor substrate W may conceivably be sensed as smaller than the actual height due to an error in sensing. In this regard, the height is sensed in a plurality of portions P within a short distance range from foreign matter EP sensed in a certain element forming region W1, as shown in FIG. 26. Also as to another element forming region W1, further, the height may be sensed on the same positions as the foreign matter EP and the portions P. The average value, for example, of the height may be regarded as the height of the foreign matter EP. The current detector HM3 may have a function of amplifying the sensing current i, so that the height of the foreign matter EP can be precisely sensed.

Initial values of the selection references may be obtained by introducing a monitor wafer into the manufacturing system MS on trial, or from a semiconductor substrate W for a past product. Thus, the semiconductor device DV having a high yield from the first can be manufactured also when introducing a semiconductor substrate W for a new product into the manufacturing system MS for the first time.

While the selection references include conditions of the magnitude and height of the foreign matter, the same may further include the position (coordinates) of the foreign matter, a map indicating the adhering situation of the foreign matter, a histogram per size of the foreign matter, image data of the foreign matter, the procedure up to the current time (the order employing the semiconductor equipment PA), the allowance time required for the step ST2a and the like. Thus, more optimum semiconductor equipment can be selected. Further, the selection references may include conditions (manual conditions) for manual selection so that the production control system MCS lets the operator select the optimum semiconductor equipment when the manual conditions are satisfied.

The height of the foreign matter may be selected by a method other than that by vertical movement of the prober HM1, such as a non-contact method utilizing irradiation with short-wavelength light (including a laser beam) or an electron beam and reflected waves thereof.

In addition to the above, techniques disclosed in gazettes of Japanese Patent Nos. 1786558, 18616143, 1886032, 1817476, 1854924, 2609594, 2082778, 2048995, 1942008 and 2523225 and U.S. Pat. Nos. 5,798,831 and 5,742,386 and Japanese Patent Laying-Open Gazettes Nos. 7-94563 and 10-233374 may be applied to the foreign matter remover PAn.

Those described with reference to the embodiment 3 are selectively combined to form the foreign matter remover PAn. The foreign matter remover PAn can cope with all adhering situations of foreign matter as the number of combinations is increased.

Modifications.

The function of sensing information from on the semiconductor substrate W may be provided in each of the n semiconductor equipment PA, or in only specific semiconductor equipment PA among the n semiconductor equipment PA. Alternatively, at least one of the n semiconductor equipment PA may be a dedicated unit for sensing information from the semiconductor substrate W.

The information on the semiconductor substrate W and the selection references may be the position (coordinates) of the foreign matter, the number of foreign matter, image data of foreign matter and the like in addition to the magnitude and height of the foreign matter, and the foreign matter may be replaced with a defect.

Alternatively, information (characters or symbols, for example) for selecting the semiconductor equipment may be provided on the rear surface of the semiconductor substrate W or a region of a scribe line or the like. Thus, it is possible to select the semiconductor equipment PA by the information on the semiconductor substrate W regardless of the information in the database DB1, so that the optimum semiconductor equipment PA can be selected in response to each semiconductor substrate W. If at least one of the plurality of semiconductor equipment is made to change (rewrite) the information of the aforementioned characters or symbols on the semiconductor substrate W in this case, the semiconductor equipment PA to be selected can be changed in an intermediate stage of the manufacturing process.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing at least one semiconductor device from a semiconductor substrate with a plurality of semiconductor equipment, comprising the steps of:

comparing information sensed from said semiconductor substrate by at least one semiconductor equipment with a selection reference;

selecting another semiconductor equipment to change the information sensed by the at least one semiconductor equipment when the sensed information exceeds the selection reference;

processing the semiconductor substrate so as to change the information on the semiconductor substrate with said another semiconductor equipment;

sensing information from said semiconductor substrate with said another semiconductor equipment after the processing step changes the information; and updating said selection reference based on the information sensed with said another semiconductor equipment.

2. The method according to claim 1, wherein said information is one of foreign matter and a defect.

3. The method according to claim 1, wherein said information is foreign matter, and wherein said processing step includes a step of removing said foreign matter with said another semiconductor equipment.

4. The method according to claim 1, wherein each of the plurality of semiconductor equipment includes a function of sensing information from said semiconductor substrate.

5. A manufacturing system for manufacturing at least one semiconductor device from a semiconductor substrate, comprising:

a plurality of semiconductor equipment; and a control unit configured to control the plurality of semiconductor equipment and configured to compare information sensed from said semiconductor substrate by at least one semiconductor equipment with a selection reference stored in a database, wherein the control unit selects another semiconductor equipment to change the information sensed by the at least one semiconductor equipment when the sensed information exceeds the selection reference, wherein the another semiconductor equipment process the semiconductor substrate so as to change the information on the semiconductor substrate, wherein the another semiconductor equipment senses information on said semiconductor substrate after the information is changed, and wherein the control unit updates the selection reference based on the information sensed with said another semiconductor equipment.

6. The system according to claim 5, wherein said information is one of foreign matter and a defect.

7. The system according to claim 5, wherein said information is foreign matter, and wherein the another semiconductor equipment removes the foreign matter.

8. The system according to claim 5, wherein each of the plurality of semiconductor equipment includes a function of sensing information from said semiconductor substrate.

9. A method of manufacturing at least one semiconductor device from a semiconductor substrate with a plurality of semiconductor equipment, comprising the steps of:

comparing information sensed from said semiconductor substrate by at least one semiconductor equipment with a selection reference;

selecting another semiconductor equipment to change the information sensed by the at least one semiconductor equipment when the sensed information exceeds the selection reference;

processing the semiconductor substrate so as to change the information on the semiconductor substrate with said another semiconductor equipment;

testing said semiconductor device after the processing step changes the information; and updating said selection reference based on a test result obtained through said testing step.

10. The method according to claim 9, wherein said information is one of foreign matter and a defect.

11. The method according to claim 9, wherein said information is foreign matter, and wherein said processing step includes a step of removing said foreign matter with said another semiconductor equipment selected.

12. The method according to claim 9, wherein each of the plurality of semiconductor equipment includes a function of sensing information from said semiconductor substrate.

13. A manufacturing system for manufacturing at least one semiconductor device from a semiconductor substrate, comprising:

a plurality of semiconductor equipment; and a control unit configured to control the plurality of semiconductor equipment and configured to compare information sensed from said semiconductor substrate by at least one semiconductor equipment with a selection reference stored in a database, wherein the control unit selects another semiconductor equipment to change the information sensed by the at least one semiconductor equipment when the sensed information exceeds the selection reference, wherein the another semiconductor equipment processes the semiconductor substrate so as to change the information on the semiconductor substrate, wherein the another semiconductor equipment tests the semiconductor device after the information is changed, and wherein the control unit updates said selection reference based on a test result obtained through the test.

14. The system according to claim 13, wherein said information is one of foreign matter and a defect.

15. The system according to claim 13, wherein said information is foreign matter, and wherein the another semiconductor device removes said foreign matter.

16. The system according to claim 13, wherein each of the plurality of semiconductor equipment includes a function of sensing information from said semiconductor substrate.

* * * * *